United States Patent
Park et al.

[11] Patent Number: 5,994,714
[45] Date of Patent: Nov. 30, 1999

[54] QUANTUM DIFFRACTION TRANSISTOR

[75] Inventors: Kyoung Wan Park, Taejon; Seong Jae Lee, Seoul; Min Cheol Shin, Taejon, all of Rep. of Korea

[73] Assignee: Electronics and Telecommunications Research Institute, Taejon-shi, Rep. of Korea

[21] Appl. No.: 08/932,189

[22] Filed: Sep. 17, 1997

[30] Foreign Application Priority Data

Oct. 28, 1996 [KR] Rep. of Korea ............... 96-48947

[51] Int. Cl.$^6$ ................ H01L 29/775; H01L 29/778
[52] U.S. Cl. ................ 257/20; 257/24; 257/192
[58] Field of Search ................ 257/20, 24, 192

[56] References Cited

U.S. PATENT DOCUMENTS

| | | | |
|---|---|---|---|
| 4,962,410 | 10/1990 | Kriman et al. | 357/22 |
| 5,280,181 | 1/1994 | Saito | 257/24 |
| 5,497,015 | 3/1996 | Ishibashi | 257/24 |
| 5,640,022 | 6/1997 | Inai | 257/24 |

*Primary Examiner*—Jerome Jackson, Jr.
*Attorney, Agent, or Firm*—Cohen, Pontani, Lieberman & Pavane

[57] ABSTRACT

The present invention discloses a technique for applying diffraction characteristic of electrons to a two-dimensional electronic device to manufacture multi-functional transistor having various ON/OFF states. A quantum diffraction transistor according to the present invention is capable of adjusting the amplitude of drain current and having various ON/OFF states utilizing diffraction characteristic of electrons by interposing a reflection-type diffraction grating in an electron path. The inventive multi-functional quantum diffraction transistor uses a two dimensional electron gas in formed at a different species junction in a semiconductor heterostructure, and has a bent electron path between the source electrode and the drain electrode with a reflection-type diffraction grating. The quantum diffraction effect of the electrons is used for the control of the diffracted drain current.

3 Claims, 2 Drawing Sheets

QUANTUM DIFFRACTION TRANSISTOR

BACKGROUND OF THE INVENTION

Field of the Invention

The present invention relates to a device structure for applying diffraction characteristics of electrons to a high electron mobility transistor to manufacture multi-functional transistor having various ON/OFF states. More particularly, a high electron mobility transistor is capable of adjusting the amplitude of the drain current and having various ON/OFF states by diffraction effect of electrons, which occurs by means of interposing a reflection type grating in an electron path.

DESCRIPTION OF THE RELATED ART

In general, diffraction characteristics of electrons mean that there is a possibility of finding the electrons at a region where the electrons can not travel by the classical movement of the scattering in conducting materials. The diffraction effect appears due to the wave property of the electrons, when the electrons pass through a certain type of the electric potential. Further, this diffraction effect of the electrons determines the intensity of the entire flow of the electrons in a field effect transistor structure, that is, the amplitude of the source-drain current. Thus a transistor using this phenomenon is so called as a quantum diffraction transistor.

It is therefore an object of the invention to provide a quantum diffraction transistor which is capable of achieving various multi-functional ON/OFF states, higher operational frequency, less gate threshold operational voltage, and higher transconductance and negative transconductances.

SUMMARY OF THE INVENTION

For the purpose of summarizing the present invention, the quantum diffraction transistor apparatus according to the present invention is provided, which comprises a source electrode, a drain electrode, and a metal gate. The electron channel consists of a quantum well structure of two dimensional electron gas formed at a different species junction in a semiconductor heterostructure. The quantum diffraction transistor is characterized in that an electron path between the source electrode and the drain electrode is bent, and further includes an electrically reflective grating at the bent electron path between the source electrode and the drain electrode of the transistor.

Preferably, the quantum diffraction transistor further includes a plurality of reflection-type grating interposed at the multiply bent electron path between the source electrode and the drain electrode of the transistor. The grating comprises electrically reflective potential walls which are periodically arranged in order to form the grating. The electrically reflective potential walls have two different reflection angles for the incident electrons.

According to the present invention, it has superior advantages that various multi-functional ON/OFF states, higher operational frequency, less power consumption, lower gate threshold operational voltage, and higher transconductance and negative transconductances can be achieved. It can also be applied to the electronic devices to provide a ultra high speed, less power consumption, and multi-functional features, used to the next generation of ultra high speed data communication systems.

BRIEF DESCRIPTION OF THE DRAWINGS

The present invention will become more apparent upon a detailed description of the preferred embodiments for carrying out the invention as rendered below.

The operation of the present invention as discussed above will now be described in detail.

DETAILED DESCRIPTION OF THE INVENTION

Figure 1A:
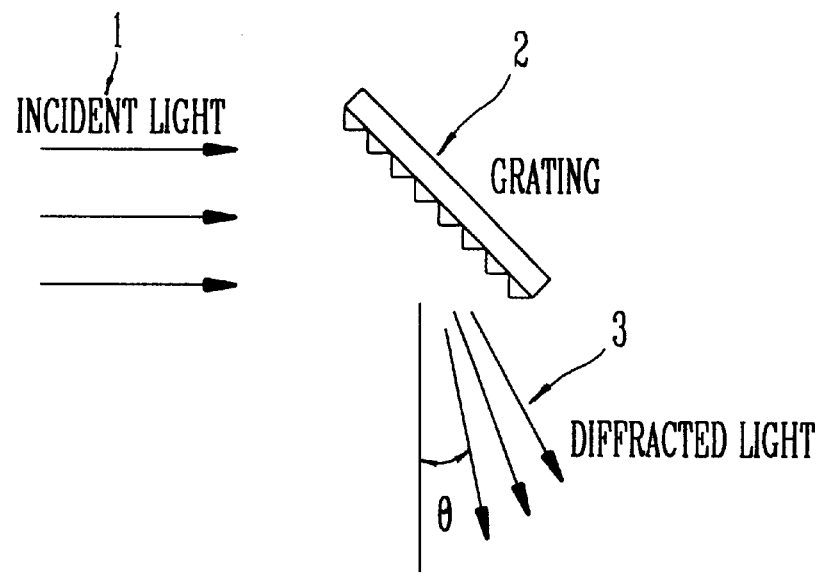
FIG. 1A is a diagram representing a diffraction state caused by a grating.

Referring now to FIG. 1A, there is shown a diagram representing a diffraction state caused by the grating. In the figure, an incident light 1 is diffracted to a predetermined angle(θ) by means of the grating 2. The intensity of the diffracted light appearing at a screen, not shown in the drawing, can be defined by the equation as follow:

$$I = Io\left[\frac{Sin\beta}{\beta}\right]^2\left[\frac{SinN\gamma}{NSin\gamma}\right]^2$$

where β is ½ kb Sin θ, γ is ½khSin θ, k is an wave vector of the light, b is an width of reflection slits, h is the distance between the slits, N is the number of the slits and θ is diffraction angle.

Figure 1B:
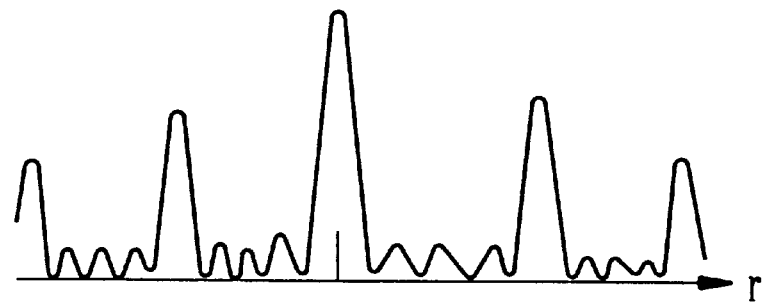
FIG. 1B is an waveform diagram representing the intensity of the light wave measured at a screen with respect to the γ value.

FIG. 1B is an waveform diagram representing the intensity of the diffracted light measured at a screen with respect to a γ value. Here, it is noted that the equation above is based on the theory of Fraunhofer diffraction formula.

Figure 2:
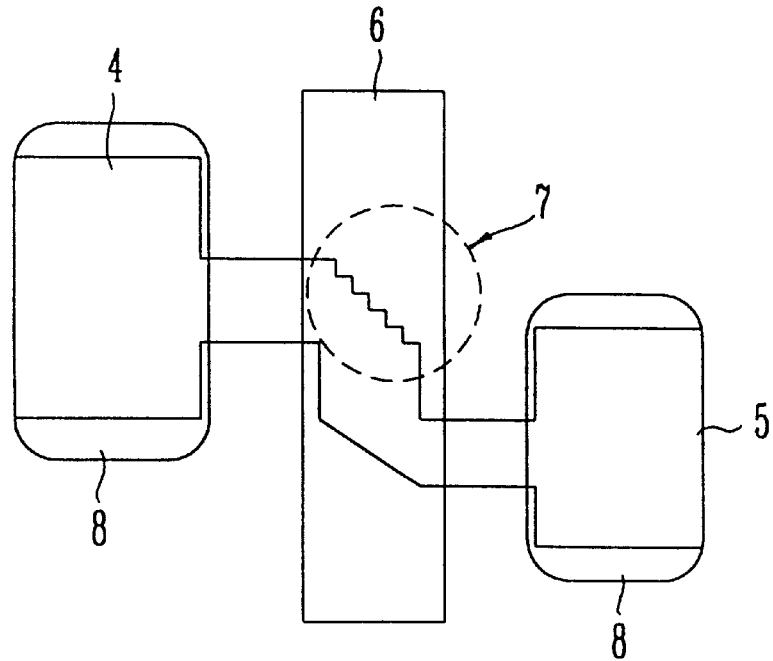
FIG. 2 is a structure illustrating a quantum diffraction transistor according to the present invention.

FIG. 2 is a structure illustrating a quantum diffraction transistor according to the present invention. A source electrode 4 and a drain electrode 5 are formed on a substrate. A bent electron path, that is a channel, is formed in the substrate between the source electrode 4 and the drain electrode 5. The bent electron path includes an electrical reflection grating 7 corrugated. A gate electrode 6 is formed on the bent electron path.

In the figure, an electrical reflection grating 7 is composed of a plurality of electrical reflective potential walls. Each segment of the electrical reflective potential walls comprises a pair of the electrically reflective potential walls whose reflection angles are greatly different. In order to adjust the density of electrons in a electron path, a gate of metal is attached on the upper portion of the electron path.

The diffraction phenomenon that occurred when the electron wave is reflected at the electron grating can be expressed by the same method as the equation described above. Here, the diffraction intensity is adjusted with the γ value as shown in FIG. 1. Further, in case that the diffraction angle(θ), the width(b), and distance(h) of the reflective potential walls, are constant, the γ value is determined only by the wave vector of the electrons (k). Since the magnitude of the wave vector of the electrons is determined depending upon the density of the electrons, and the density of the electrons is determined depending on the voltage of the metal gate, the diffraction intensity of the electrons is determined by the gate voltage. Therefore the amplitude of the diffraction current is adjusted by the gate voltage.

Now, the method of manufacturing the quantum diffraction transistor according to the present invention will be described hereinafter.

An etching pattern for forming source 4 and drain regions 5 of the transistor, a bent electron path, and a grating 7 is formed using a lithography technique. The resulting substrate outside the pattern is etched down to the electron path layer, then the bent electron path including the grating 7 is formed. Ohmic contacts 8 are formed in the source 4 and drain regions 5 of the transistor. A metal gate of an Al or Ti/Au is formed on the electron path using lithography, metalization, and lift-off techniques to cover the electron path and the grating 7.

Figure 3:
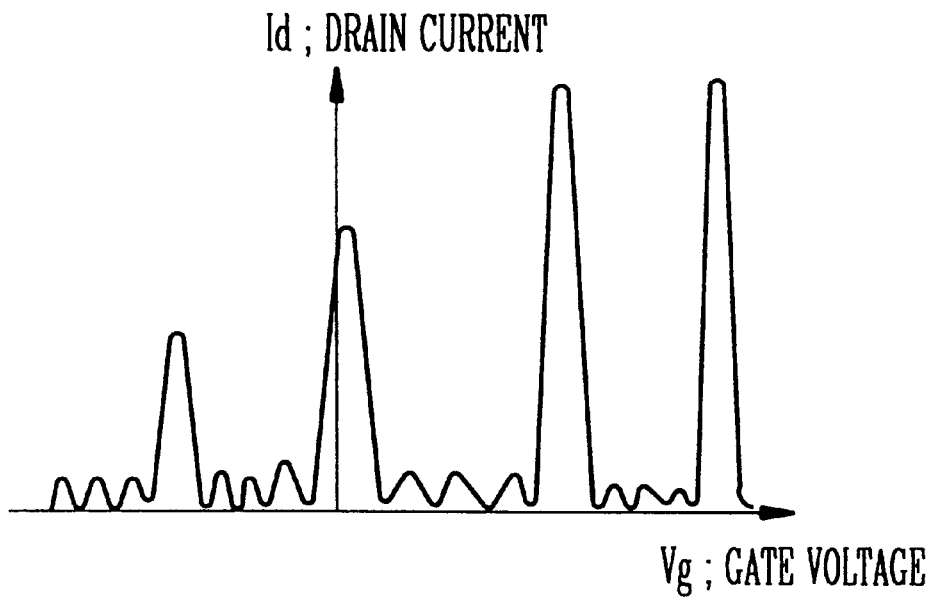
FIG. 3 is an waveform diagram representing the change of a drain current with respect to a gate voltage of the quantum diffraction transistor according to the present invention.

FIG. 3 is an waveform diagram representing the change of a drain current with respect to a gate voltage of the quantum diffraction transistor according to the present invention.

In the drawing, it shows characteristics that the amplitude of drain current due to the quantum diffraction phenomenon of the electrons is different from that of the classical transistor in the prior art. In an ideal case, there are various ON/OFF states at the drain current. Further, in addition to this various multi-functional property of the transistor mentioned above, it shows another characteristic of the high transconductance and negative transconductance in certain gate voltage ranges.

In the quantum diffraction phenomenon of the electrons, the electrons should move in wave fashion so as not to lose an interference nature thereof, while the electrons pass between the source electrode and the drain electrode of the transistor. However, in the solid state, the interference nature of the electrons is lost due to the inelastic collisions therebetween. Therefore, in order to obtain the operational feature of the transistor by means of the quantum mechanical phenomenon, it is necessary either to reduce a primary factor which arises the inelastic collisions, or to reduce the size of the transistor so that the electrons can quantum-mechanically interfere each other before occurrence of the inelastic collision of the electrons.

Figure 4:
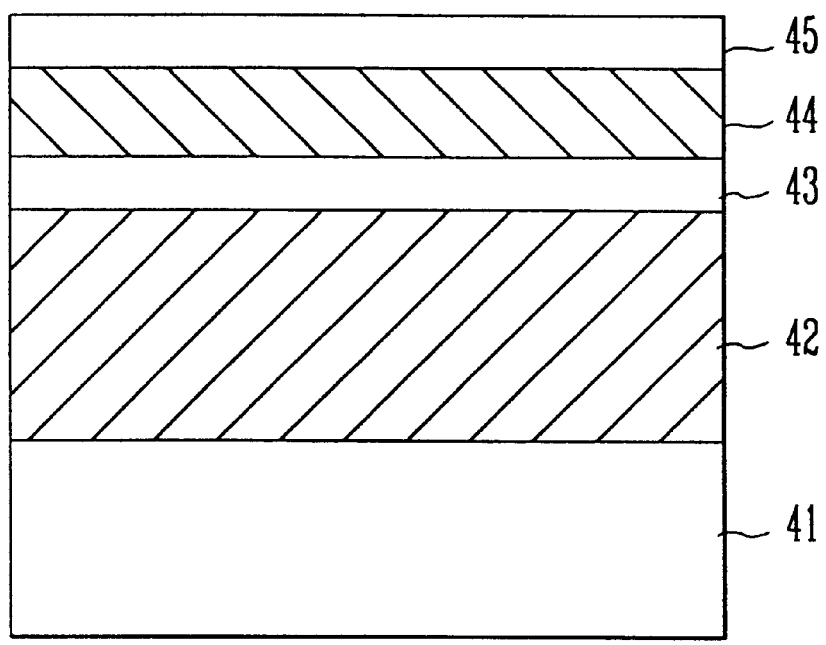
FIG. 4 is a sectional view of the substrate of the quantum diffraction transistor according to the present invention.

FIG. 4 is a sectional view of the semiconductor substrate applied to the present invention. Two dimensional electron gas layer is formed by growing a GaAs buffer layer 42 and an AlGaAs spacer layer 43 on a semi-insulating GaAs substrate 41 using a Molecular Beam Epitaxial growth method or a Metal Organic Chemical Vapor Deposition method. AlGaAs barrier 44 grown with silicon doping and a GaAs cap layer 45 are successively formed.

As fully described above, in the present invention it has superior advantages that various multi-functional ON/OFF states, higher operational frequency, less power consumption, lower gate threshold operational voltage, and higher transconductance and negative transconductances can be achieved. Further, the present invention can also be applied to the electronic devices to provide a ultra high speed, less power consumption, multi-functional features, used to the next generation of ultra high speed data communication system.

The present invention has been described with reference to a particular embodiment in connection with a particular application. Those having ordinary skill in the art and access to the teachings of the present invention will recognize additional modifications and applications within the scope thereof. It is therefore intended by the appended claims to cover any and all such applications, modifications, and embodiments within the scope of the present invention.

What is claimed is:

1. A multi-functional quantum diffraction transistor formed in a semiconductor substrate, comprising:

a source electrode;

a drain electrode;

a bent electrode path formed between said source electrode and drain electrode;

a gate electrode disposed on said bent electrode path for biasing an electron channel, thereby controlling electron density in the electron channel; and an electron reflection grating formed in the bent electron path for diffracting electrons at angles to vary current at the drain electrode.

2. The quantum diffraction transistor in accordance with claim 1, wherein said electrical reflection grating comprises electrically reflective potential walls periodically arranged therein, said electrically reflective potential walls having different reflection angles for incident electrons.

3. The quantum diffraction transistor in accordance with claim 1, wherein the semiconductor substrate comprises an AlGaAs/GaAs junction.

* * * * *